(12) United States Patent
Miller

(10) Patent No.: US 6,292,907 B1
(45) Date of Patent: Sep. 18, 2001

(54) STATE MACHINE BIT GROUP SELECTION APPARATUS FOR DEBUGGING A DIGITAL SYSTEM

(75) Inventor: John P. Miller, Rocklin, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/124,393

(22) Filed: Jul. 29, 1998

(51) Int. Cl.[7] .................................................. H03K 19/003
(52) U.S. Cl. ................. 714/25; 714/45; 714/47; 714/724; 714/742; 714/703
(58) Field of Search .............................. 714/25, 724, 45, 714/47, 742

(56) References Cited

U.S. PATENT DOCUMENTS

| | | | |
|---|---|---|---|
| 4,546,472 | * | 10/1985 | Volk et al. ............................. 714/724 |
| 5,202,624 | * | 4/1993 | Gheewala et al. ..................... 324/754 |
| 5,528,364 | * | 6/1996 | Roohparvar ........................... 714/724 |
| 5,604,432 | * | 2/1997 | Moore et al. ........................ 324/158.1 |
| 5,630,048 | * | 5/1997 | Joie et al. ............................... 714/25 |
| 5,646,545 | * | 7/1997 | Trimberger et al. .................... 326/38 |

* cited by examiner

*Primary Examiner*—Meng-Al T. An
*Assistant Examiner*—Nabil El-Hady

(57) ABSTRACT

Apparatus selects a state machine bit group from a plurality of state machine bit groups of a digital system for debugging the state machine connected to the selected bit group. The apparatus is adapted to output the bits of the selected bit group using existing output pins of the digital system, and includes a first multiplexer which is adapted to be connected to the plurality of state machine bit groups for outputting the selected state machine bit group. A second multiplexer is adapted to be connected to system signals and the selected state machine bit group from the first multiplexer, and outputs one of the system signals and the selected state machine bit group via the output pins of the system. A control circuit supplies a first select signal to the first multiplexer for selecting the selected state machine bit group output by the first multiplexer, and supplies a second select signal to the second multiplexer for selecting one of the selected bit group and the system signals.

10 Claims, 2 Drawing Sheets

STATE MACHINE BIT GROUP SELECTION APPARATUS FOR DEBUGGING A DIGITAL SYSTEM

Figure 1:
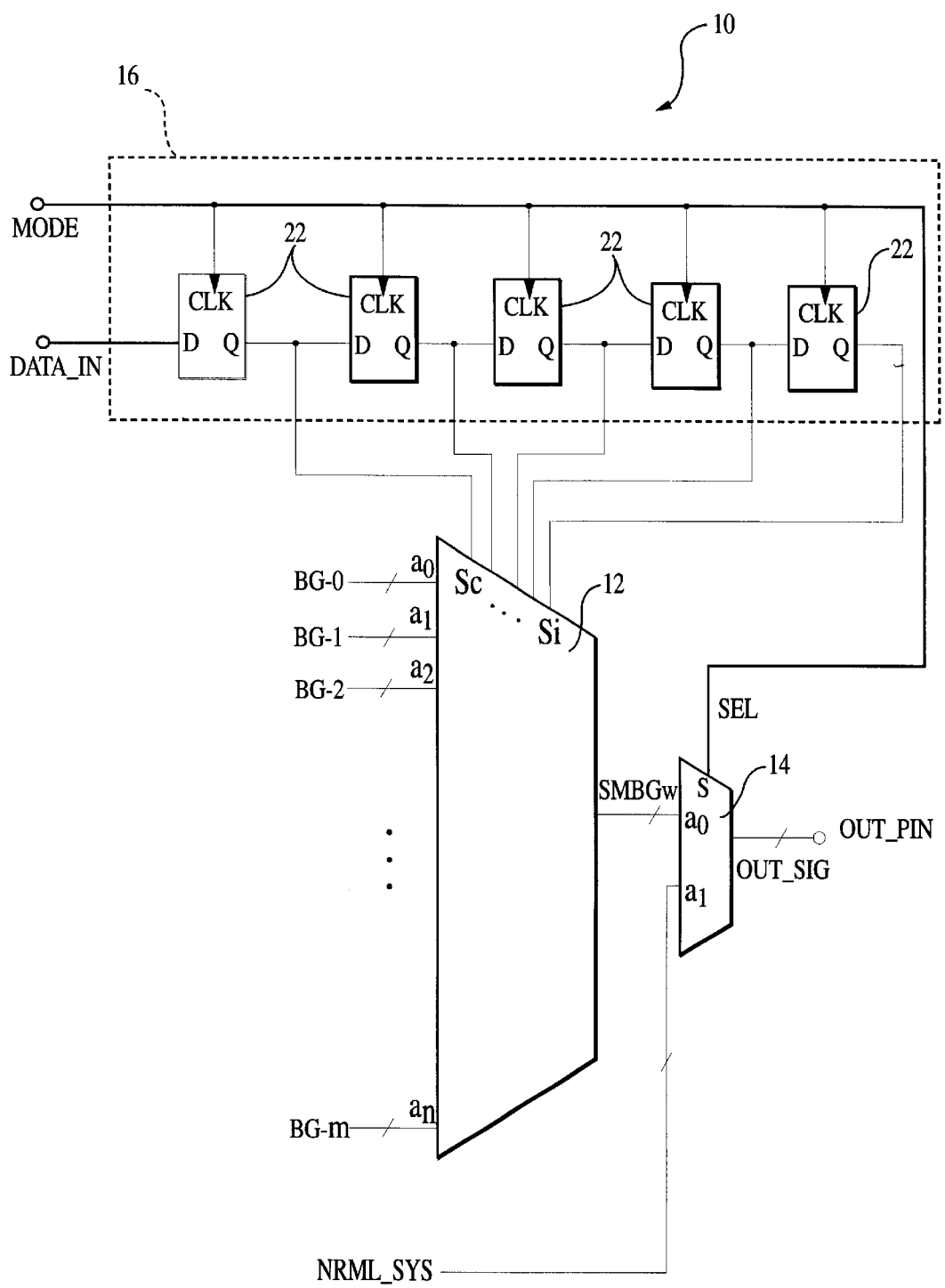

The present invention generally relates to apparatus for monitoring the state machines of digital systems, and more particularly to an apparatus adapted to interface between the state machines and the output pins of a digital system for selecting a particular bit group from a plurality of state machine bit groups and transmitting the output of the selected bit group to the system output pins.

It is common in digital system environments to monitor the output bits of the state machines for purposes of "debugging" the system. Debugging is a way of determining whether a system has a "bug," i.e., whether the system has been designed correctly, as opposed to checking the system for physical defects. One method of debugging a digital system is to examine the outputs and the inputs of the system, for example, keyboard presses, RAM accesses, etc. While this method may be effective in finding bugs which are readily detectable from the outside the system, it is inadequate in locating bugs which originate from within the system and cannot be detected from observing the inputs and the outputs of the system. One solution to this problem is to monitor the system state machines, which are abstract models of the circuitry indicating the states of the system. The state machines have a finite number of states, and therefore, they can be monitored to "view" the internal operation of the system. In this manner, the states of the state machines can be known at any particular time and the source of the bugs can be located.

A problem associated with monitoring the state machines is that the output bit lines of the state machines have to be connected to the output pins of the system. However, digital circuitry or systems are typically implemented on integrated chips, and as a result, there is a physical limitation as to the number of system output pins which may be connected to the state machine output bit lines. Typical digital systems have numerous groups of state machine bit lines, with each group having many bit lines. It would be impracticable in view of the physical constraints of the system to provide an output pin for each of the bit lines. One known solution to this problem is to have a microprocessor within the system select and connect only the bit lines of the state machine to be monitored to the output pins of the system. This solution, however, would not be effective if the microprocessor itself has a bug, or if the microprocessor is not operational.

Accordingly, it is a primary objective of the present invention to provide an improved apparatus for monitoring the state machines of a digital system.

Another object of the present invention to provide an improved apparatus for interfacing between the state machines and the output pins of the digital system.

Still another object of the present invention is to provide such an improved apparatus which allows the state machine bits to be output from the system without adding dedicated state machine output pins.

Yet another object of the present invention is to provide such an improved apparatus which selects a particular state machine bit group from a plurality of bit groups without employing a microprocessor.

A further object of the present invention is to provide such an improved apparatus having a minimal number of data input pins used in selecting the particular bit group.

Figure 2:
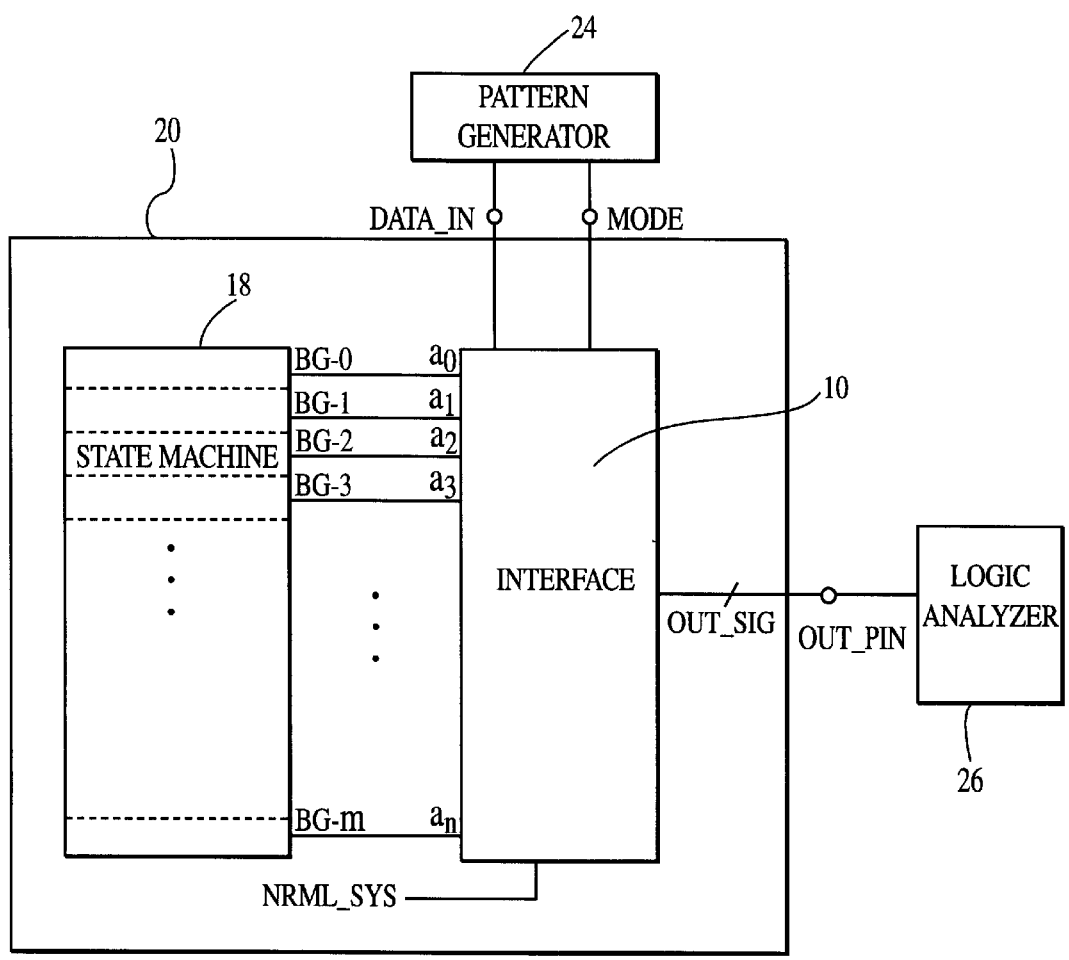

Other objects and advantages will become apparent upon reading the following detailed description, in conjunction with the attached drawings, in which:

FIG. 1 is an electrical schematic diagram of a circuit interface embodying the present invention; and FIG. 2 is a block diagram embodying the present invention including the interface of FIG. 2.

DETAILED DESCRIPTION

The present invention is directed to an apparatus for monitoring state machines of a digital system, including an interface for connecting the state machine output bits with the output pins of the system. The input side of the interface is connected to each of the state machine bit lines which are divided into a number of groups. Only one group of bit lines is selected at a time as specified through a selecting circuit. The normal operational output signals of the system are also connected to the input side of the interface. The output side of the interface is connected to the system output pins, which output the selected bit group when the interface is in a monitor mode and the normal system operational signals when in a normal operation mode.

Broadly stated, the present invention is directed to an apparatus for selecting a state machine bit group from a plurality of state machine bit groups of a digital system for debugging the state machine connected to the selected bit group. The apparatus is adapted to output the bits of the selected bit group using existing output pins of the digital system, and includes a first multiplexer which is adapted to be connected to the plurality of state machine bit groups for outputting the selected state machine bit group. A second multiplexer is adapted to be connected to normal system signals and the selected state machine bit group from the first multiplexer, and outputs one of the system signals and the selected state machine bit group via the output pins of the system. A control circuit supplies a first select signal to the first multiplexer for selecting the selected state machine bit group output by the first multiplexer, and supplies a second select signal to the second multiplexer for selecting one of the selected bit group and the system signals.

Turning now to FIG. 1, the circuit interface apparatus of the present invention is indicated generally at 10 and includes a first multiplexer 12, a second multiplexer 14 and a multiplexer select control circuit 16. The input ports $a_0$, $a_1$, ... $a_n$ of the first multiplexer 12 are connected to state machine bit groups (SMBG) BG-0 to BG-m, where $m \leq n$. Each of the bit groups BG-0 to BG-m consists of a plurality of bit lines, 32 in the preferred embodiment. The SMBGs originate from state machines 18 of a digital system 20 (shown in FIG. 2) and output bits through the serial bit lines which reveal the status of their respective state machines. The first multiplexer 12 also includes select ports $s_0$, ... $s_i$ for selecting SMBGs connected to the input ports $a_0$, ... $a_n$. In the preferred embodiment, the first multiplexer 12 has 32 input ports $a_0$, ... $a_n$, i.e., n=31, and five select ports $s_0$, ... $s_i$, i.e., I=4, so as to access all the input ports. Each of the input ports $a_0$, ... $a_n$ is adapted to receive 32 bit lines. It should be noted, however, other multiplexers may be utilized which have more or less than 32 input ports $a_0$, ... $a_n$, each of which is adapted to receive more or less than 32 bit lines, so as to correspond with the number of SMBGs and bit lines of the state machines 18.

The SMBG which is output from the first multiplexer 12 is selected by the multiplexer select control circuit 16 via the select ports $s_0$, ... $s_i$. The selected SMBG (SMBGw) is supplied to the second multiplexer 14, which also has the normal system (NRML_SYS) signal lines such as FLASH or programmable ROM interface lines connected to its input. In this manner, the second multiplexer 14 outputs either the SMBGw from the first multiplexer 12 or the NRML_SYS signals in accordance with a select (SEL) signal provided by the multiplexer select control circuit 16 to the second multiplexer. The selected output (OUT_SIG) signals are then transmitted through to the output pins (OUT_PIN) of the system 20.

In the multiplexer select control circuit 16, five delay flip-flops (D F/F) 22 are arranged so that binary numbers from 00000 to 11111 (0 to 32) can be generated and supplied to the select ports $s_0, \ldots s_i$ of the first multiplexer 12 to select any of the BG-0 to BG-31 connected to the input ports $a_0, \ldots a_n$.

In accordance with one important aspect of the present invention, the control circuit 16 includes only two external input pins for operating the present invention. One is a mode (MODE) pin for supplying clock (CLK) signals to the D F/Fs and the SEL signals to the second multiplexer 14, and the other is a data input (DATA_IN) pin for specifying any of the BG-0 to BG-m to be selected by the control circuit 16.

It should be understood that the DATA_IN pin may be an existing pin on the system that is not frequently used, for example, a pin for overriding a password of the system 20. If such a pin is utilized, only one additional external input pin, i.e, the MODE pin, needs to be added to the system. Of course, if no existing pin is available for use as the DATA_IN pin, two external input pins would have to be added to the system 20.

Turning now to FIG. 2, the interface 10 is connected between the state machines 18 and the OUT_PIN of the digital system 20. A pattern generator 24 is connected to the interface 10 for supplying the CLK and the SEL signals to the MODE pin, and data for specifying the SMBG to be output by the first multiplexer 12 to the DATA IN pin. The OUT_PIN of the system 20 is connected to the logic analyzer 26 which receives the OUT_SIG signals from the interface 10 and debugs the state machine 18 that generated the OUT_SIG signals.

It should be noted that while the pattern generator 24 is the preferred means for providing the operational signals to the interface 10, use of other instruments are contemplated, such as a computer or even switches. Also, the logic analyzer 26 may be replaced with a computer, LEDs or any test instruments adapted to give indication of the states of the state machines.

The present invention has two modes of operation. In normal operation, the MODE pin is held low so that the NRML_SYS signals are selected by the second multiplexer 14. In this normal operation, the second multiplexer 14 outputs the NRML_SYS signals as the OUT_SIG signals, which are then transmitted to the OUT_PIN. In monitor operation, the DATA_IN pin is held high or low and the MODE pin is cycled low to high to serially shift the bits through the D F/Fs until all five D F/Fs are at desired settings. Then the MODE pin is kept high so that the second multiplexer 14 outputs the SMBGw selected by the control circuit 16 as the OUT_SIG signals. For example, if the D F/Fs 18 are set to 10010, the SMBGw output by the first multiplexer 12 would be the signals or inputs BG-18, which would also be the OUT_SIG signals transmitted by the second multiplexer 14 to the OUT_PIN of the system. By monitoring the OUT_PIN, the status of the state machine connected to BG-18 can be readily obtained.

From the foregoing description, it should be understood that an improved interface for a digital system has been shown and described which has many desirable attributes and advantages. It is adapted to interface with state machines for debugging the system without the aid of the system microprocessor. Another advantage is that the present invention only requires at most two external input pins to be added onto the system, and utilizes the existing system output pins to avoid adding additional pins.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. Apparatus for selecting a state machine bit group from a plurality of state machine bit groups of a state machine of a digital system, said apparatus comprising:

a first multiplexer adapted to be connected to a plurality of state machine bit groups for outputting a selected state machine bit group;

a second multiplexer adapted to be connected to system signals and said selected state machine bit group from said first multiplexer, and outputting either said system signals or said selected state machine bit group; and control means for supplying a first select signal to said first multiplexer to enable said first multiplexer to output said selected state machine bit group, and for supplying a second select signal to said second multiplexer to enable said second multiplexer to output either said selected state machine bit group or said system signals;

wherein said control means is adapted for generating said first and said second select signals.

2. The apparatus as defined in claim 1 wherein said control means is adapted to receive first input data for enabling said control means to output said first and said second select signals.

3. The apparatus as defined in claim 2 further wherein said control means is adapted to receive second input data for generating said first select signal.

4. The apparatus as defined in claim 3 wherein said control means comprises a plurality of flip-flops.

5. The apparatus as defined in claim 4 wherein said flip-flops are D flip-flops.

6. The apparatus as defined in claim 5 wherein said second input data for generating said first select signal are serially supplied to said D flip-flops.

7. The apparatus as defined in claim 1 wherein said control means comprises at least one flip-flop.

8. The apparatus as defined in claim 7 wherein said flip-flop is a D flip-flop.

9. Apparatus for debugging a plurality of state machines in a digital system, said apparatus being adapted to select a state machine bit group from a plurality of state machine bit groups and to output bits from the selected bit group to existing output pins of the digital system, so that a state machine connected to the selected state machine bit group can be debugged, said apparatus comprising:

a first multiplexer adapted to be connected to the plurality of state machine bit groups for outputting the selected state machine bit group;

a second multiplexer adapted to be connected to system signals and the selected state machine bit group from said first multiplexer, and output either said system signals or the selected state machine bit group via the output pins of the digital system;

control means for supplying a first select signal to said first multiplexer for selecting the selected state machine bit group output by said first multiplexer, and for supplying a second select signal to said second multiplexer for selecting one of the selected state machine bit group or said system signals;

data input means for supplying data to said control means for generating said first and said second select signals; and monitoring means connected to the output pins of the digital system for receiving the bits from the selected state machine bit group and debugging the state machine connected to the selected state machine bit group.

10. The apparatus as defined in claim 9 further comprises at least one input pin connected to said control means and adapted to receive said data input by said data input means.

* * * * *